United States Patent [19]

Olmstead

[11] Patent Number: 4,589,002

[45] Date of Patent: May 13, 1986

[54] DIODE STRUCTURE

[75] Inventor: John A. Olmstead, Branchberg Township, Somerset County, N.J.

[73] Assignee: RCA Corporation, Princeton, N.J.

[21] Appl. No.: 631,869

[22] Filed: Jul. 18, 1984

[51] Int. Cl.[4] .................. H01L 29/06; H01L 29/90; H01L 29/91

[52] U.S. Cl. ...................................... 357/13; 357/20

[58] Field of Search ............ 357/13, 20, 23.13, 23.11, 357/35

[56] References Cited

U.S. PATENT DOCUMENTS

| | | | |
|---|---|---|---|
| 3,345,221 | 10/1967 | Lesk | 148/179 |
| 3,513,042 | 5/1970 | Hagon | 148/187 |
| 3,850,708 | 11/1974 | Imaizumi | 148/187 |
| 4,025,802 | 5/1977 | Inoue et al. | 357/14 |
| 4,062,039 | 12/1977 | Nishimura | 357/13 |
| 4,100,565 | 7/1978 | Khajezadeh et al. | 357/35 |
| 4,419,681 | 12/1983 | Schmitz | 357/13 |

*Primary Examiner*—Martin H. Edlow
*Assistant Examiner*—E. Fallick
*Attorney, Agent, or Firm*—Birgit E. Morris; Donald S. Cohen; James M. Trygg

[57] ABSTRACT

A diode structure is disclosed wherein the diode includes a body of a first type conductivity material; a first region of a second conductivity material in the body and having an opening therein through which a portion of the body projects; and a second region of the first conductivity material in the portion of the body that projects through the opening. The second region is rotationally positioned with respect to the first region so that it partially overlaps the first region at points of intersection of the two regions. These points of intersection are the rectifying junctions. The respective shapes of the opening and of the second region are arranged so that the sum of the areas of the breakdown junctions is a constant value notwithstanding that the second region may be displaced or misaligned with respect to the first region, provided that relative displacement or misalignment of the two regions is within defined limits.

13 Claims, 7 Drawing Figures

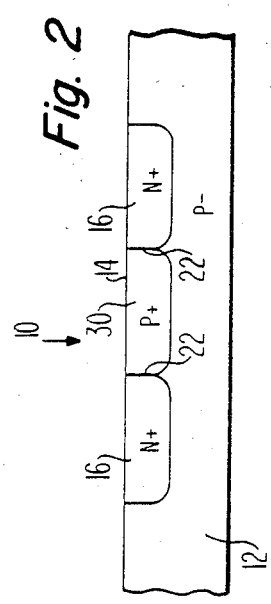
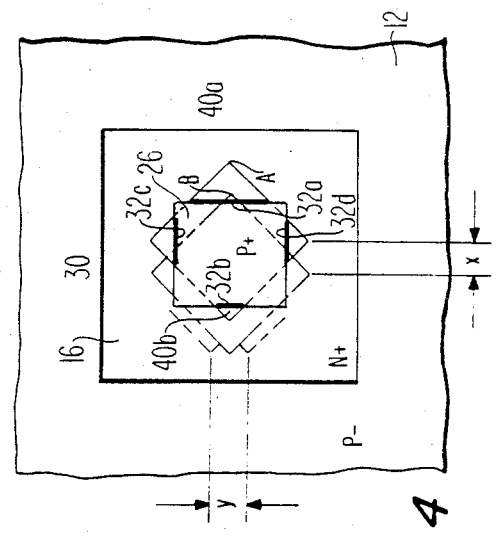
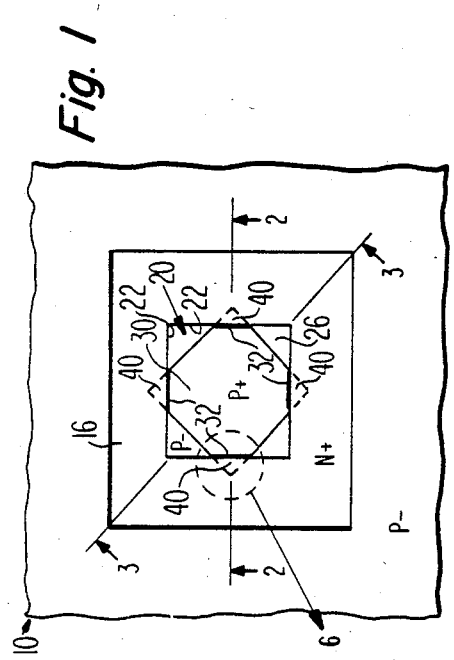
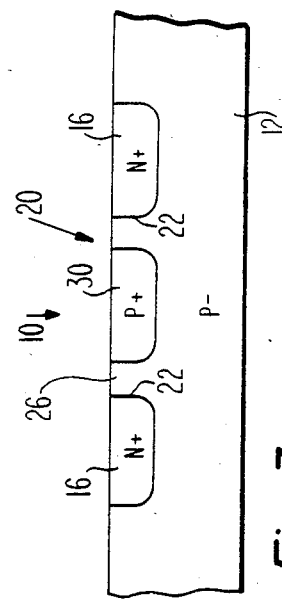

DIODE STRUCTURE

The present invention relates to diode structures for integrated circuits.

BACKGROUND OF THE INVENTION

While the present invention relates to diode structures in general, for purposes of the following discussion a zener diode structure is addressed. It will be understood, however, that all diode structures are considered within the spirit and scope of the invention.

There are several possible structural arrangements of the P and N regions forming the rectifying junction of a diode or, in this case, the zener breakdown junction. A commonly used structure utilizes a body of P type conductivity material having a relatively low level of doping. A first region of N type conductivity materal extends downwardly from a planar surface of the body. A second region of highly doped P type conductivity material is within the body and beneath the first region thereby forming a PN junction at the area of contact of the first and second regions. This PN junction forms the rectifying or zener breakdown junction of the diode, the junction being substantially parallel to the planar surface of the bulk material. For a more detailed description of a diode having this structure, see U.S. Pat. No. 3,345,221 which issued Oct. 3, 1967 to Lisk.

Another structural arrangement of the P and N regions of a diode utilizes a layer of semiconducting material that is attached to an insulating substrate. Adjacent P and N regions are formed in the semiconducting material so that they penetrate the entire thickness of the layer. This arrangement yields a rectifying junction that is essentially perpendicular to the substrate. See, for example, U.S. Pat. No. 3,513,042 which issued May 19, 1970 to Hagon which illustrates this type of structure.

Zener diodes generally have a breakdown voltage that is accurately determinable, stable, and reproducible. The actual voltage at which breakdown occurs varies over a finite range of values which are related to the physical structure of the device. Usually, at lower current levels, breakdown begins at a single point in the junction. As the current increases the voltage increases causing the breakdown phenomenon to spread until the entire junction is conducting current. At this point the voltage has stabilized at a value slightly higher than that when breakdown first began.

While it is beneficial to increase current at the breakdown junction to effect breakdown of the entire junction, it is also desirable to maintain the total current passing through the device at a low level to keep power consumption within reasonable limits. One way to accomplish this is to reduce the area of the breakdown junction while maintaining the total current passing through the device at a fixed level sufficiently high that the entire junction is conducting. The reduced area requires less current to assure that the entire junction is conducting. The present invention achieves this by means of a novel structure which is insensitive to substantial mask misalignment during manufacture.

SUMMARY OF THE INVENTION

According to the present invention a diode is provided comprising a body of semiconducting material having a substantially planar surface. A first region of one conductivity type is disposed in the body and extends downwardly from the planar surface. The first region has an opening bounded by a plurality of sides through which a portion of the body projects so that the first region encircles the portion of the body. A second region of the opposite conductivity type is disposed within the portion of the body and extends downwardly from the planar surface. The second region bounded by a plurality of sides partially overlaps the first region so that at least two rectifying junctions exist at the intersections of the first and second regions. Each of the rectifying junctions has a finite area and is positioned with respect to the first and second regions so that the sum of the areas of the junctions is a constant value independent of the lateral position of the second region with respect to the first region.

BRIEF DESCRIPTION OF THE DRAWINGS

FIG. 1 is a schematic representation of a top view of a portion of a semiconductor device showing an embodiment of the teachings of the present invention;

FIG. 2 is a cross sectional view taken along the lines 2—2 of FIG. 1;

FIG. 3 is a cross sectional view taken along the lines 3—3 of FIG. 1;

FIG. 4 is a view similar to that of FIG. 1 showing a range of displacement of one region with respect to another region;

DESCRIPTION OF THE PREFERRED EMBODIMENT

Figure 5B:
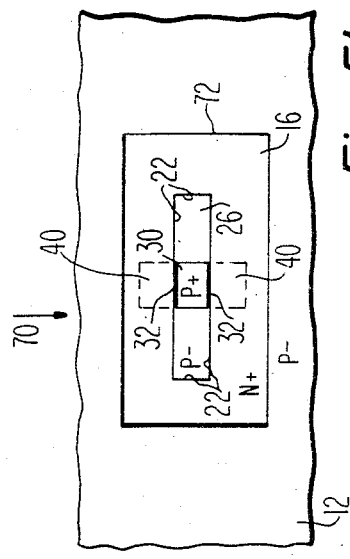
FIG. 5b is a view similar to that of FIG. 1 showing a third embodiment of the invention.

There is shown in FIGS. 1 through 4 a diode 10 comprising a body 12 of a semiconducting material such as monocrystalline silicon having a substantially planar surface 14. The body 12 is of a low doping level first type conductivity material which, in the present case is P type material. A first region 16 of a highly doped second type conductivity material which, in the present case is N type material, is disposed within the body 12 and extends downwardly from the planar surface 14. The region 16 has a substantially square opening 20 therethrough having substantially straight sides 22 which bound the region 16, as shown in FIGS. 1, 2 and 3. A portion 26 of the body 12 projects upwardly through the opening 20 and terminates at the planar surface 14, as seen in FIG. 3. The body 12 and first region 16 are formed by methods that are well known in the art and therefore will not be described here.

A second region 30 of a highly doped first type conductivity material, P type in the present case, is disposed within the portion 26 of the body 12. The second region 30 is substantially similar in shape and size to that of the opening 20 however, it is rotationally displaced thereto approximately 45 degrees as shown in FIG. 1. This angular displacement causes zener rectifying junctions 32 to be formed at the intersections of the first and second regions 16 and 30, as shown in FIG. 1. The region 30 may be formed by any conventional method known in the art such as vapor diffusion or ion implantation.

Figure 6:
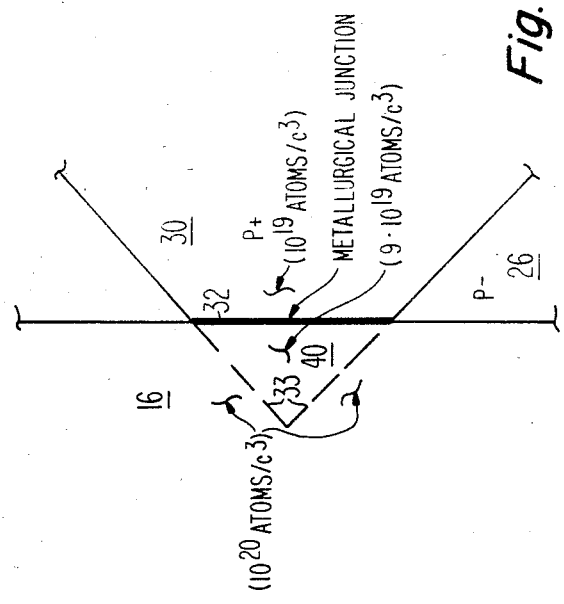
FIG. 6 is an enlarged view of a portion of FIG. 1 encircled by the dashed line and indicated by the reference number 6.

When forming the region 30, there will be a partial overlap of the first region 16 by the corners of the region 30 thereby forming overlap areas 40, as shown in FIG. 1. An enlarged view of one of these overlap areas 40 and surrounding area is shown in FIG. 6. There, the relative doping levels of the first and second regions and the overlap area 40 are illustrated. The first region 16 has a doping concentration of about $10^{20}$ atoms/C$^3$ of N type material, phosphorus for example, while the second region 30 has a doping concentration of about $10^{19}$ atoms/C$^3$ of P type material which may be boron for example.

Since the doping concentration of the first region 16 is about ten times that of the second region 30, the overlap areas 40 will remain predominantly N Type having a doping concentration of about $9\times10^{19}$ atoms/C$^3$ which is about nine times that of the second region 30. The metallurgical junction formed by the intersection of the second region 30 with the overlap area 40 is the rectifying junction 32 or zener breakdown junction.

While, in the present case a preferred structure has been described, an alternative structure is possible wherein the first region 16 is of P type material and the second region 30 is of N type material. The second region 30 will have a doping concentration about ten times that of the first region wherein the metallurgical junction will exist along the dashed lines 33 as shown in FIG. 6 instead of along the line indicated by 32. The reason for this is that the overlap area 40 will still have a doping concentration of about $9\times10^{19}$ atoms/c$^3$ which is about nine times that of the first region 16. The following discussion is equally applicable to both the preferred and alternative structures.

Ideally, the second region 30 is laterally positioned, with respect to the first region 16, so that the overlap areas 40 are of approximately equal size, as shown in FIG. 1. This ideal case, however, is rarely achieved due to tolerances inherent in the manufacturing process. Should the lateral position of the second region 30 be such that the second region 30 is displaced to the right as indicated at A in FIG. 4, the overlap area 40a will be larger than the overlap area 40b and the junction 32a will be correspondingly larger than the junction 32b. It will be understood that the sum of the areas of the two junctions 32a and 32b exactly equals the combined area of two of the junctions 32 as illustrated in FIG. 1. Similarly, should the lateral position of the second region 30 be such that the second region 30 is displaced to the left as indicated at B in FIG. 4, the overlap 40b and junction 32b will be correspondingly larger than the overlap 40a and junction 32a.

The amount of total displacement of the second region 30 to the right and left should be constrained to an amount indicated by X in FIG. 4 wherein both the junctions 32a and 32b are present. Should the displacement of the second region 30 exceed that amount in either the right or left directions, one of the right and left corners of the region 30 would fall completely within the portion 26 and not overlap the region 16. In this case the area of the junction 32a or 32b that would be formed would be greater than the combined area of two of the junctions 32 as illustrated in FIG. 1. Similarly, should the lateral position of the second region 30 be such that the second region 30 is displaced upwardly or downwardly, as viewed in FIG. 4, a distance Y wherein both of the junctions 32c and 32d exist. In fact, any combination of X and Y displacement may occur as long as all four junctions 32a, 32b, 32c, and 32d are formed.

This structure provides a significant advantage in the manufacturing of the device since there may be substantial misalignment of the region 30 with respect to the region 16, within the X and Y limits described above. Such a misalignment will have no affect on the total area of the zener breakdown junctions, this area remaining at a constant amount. This structure is also beneficial when utilized in a non-zener diode in that a well controlled and predictable rectifying junction is repeatably obtainable.

The above description of the zener diode 10 deals with a structure wherein both the opening 20 of the first region 16 and the second regions 30 are square and of similar size. There are numerous alternative structures, however, that are within the spirit and scope of the present invention. Such an alternative structure is depicted in FIG. 5a. There, a zener diode 50 is shown having a first region 16 with an opening 20 of hexagonal shape having six straight sides 22 of equal length. A first region 16 is similar to that of the diode 10 having a periphery 52 which may optionally assume the shape of the opening 20. A second region 30, similar to that of the diode 10, is provided and is of rectangular shape having corners that overlap the region 16. When the region 30 is formed, overlap areas 40 will be formed similar to those of the diode 10 shown in FIG. 1. Additionally, rectifying junctions 32, or zener breakdown junctions, are formed at the intersections of the regions 16 and 30 as shown in FIG. 5a. These junctions 32 and the doping levels of the areas surrounding them are similar to those of the diode 10 as depicted in FIG. 6. As with the zener diode 10, the sum of the areas of the junctions 32 of the diode 50 will remain at a constant value notwithstanding that the region 30 may be displaced with respect to the region 16. This will be true provided that any displacement occurs within those limits defined for the diode 10.

While the regions 16 and 30 of the diode 50 are of hexagonal and rectangular shapes respectively, they may take on other polygon shapes wherein the number of sides is an even number, that opposite sides are parallel and the sides are straight. Further, the regions 16 and 30 may, but need not take on identical shapes. The important requirement is that the second region 30 have corners that intersect opposite sides of the region 16 thereby forming an even number of overlap areas 40. This will assure that the sum of the areas of the zener junctions 32 will remain a constant value should the region 30 be displaced with respect to the region 16 an amount within the previously defined limits.

Figure 5A:
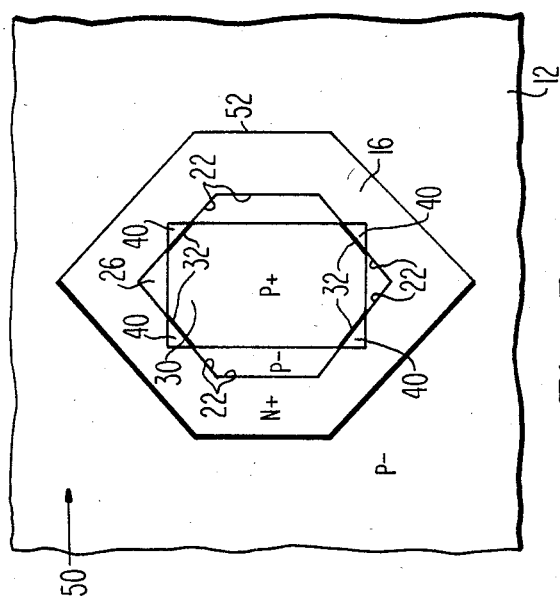
FIG. 5a is a view similar to that of FIG. 1 showing a second embodiment of the invention.

Another alternate structure is depicted in FIG. 5b. There a zener diode 70 is shown having a first region 16 with an opening 20 of rectangular shape having straight sides 22. A first region 16 is similar to that of the diode 10 having a periphery 72 which may, optionally, assume the shape of the opening 20. A second region 30, similar to that of the diode 10, is provided and is of rectangular shape. The second region 30 is arranged so that its longitudinal axis is transverse to that of the portion 26, as shown in FIG. 5b. When the second region 30 is formed, the two overlap areas 40 will be similar to those of the diode 10, however, they will have a substantially rectangular shape as shown in FIG. 5b. With this structure, a pair of rectifying junctions 32 are formed at the intersection of the regions 16 and 30 similar to the junctions 32 of the diodes 10 and 50. The junctions 32 of the diode 70 and the doping levels of the areas surrounding the junctions are similar to those of the diodes 16 and 50 as depicted in FIG. 6. Additionally, it will be understood that the sum of the areas of the pair of junctions 32 of the diode 70 will remain at a constant value notwithstanding that the region 30 may be displaced with respect to the region 16 provided that any displacement does not eliminate one or both of the pair of junctions.

We claim:

1. A diode comprising a body of semiconducting material having a substantially planar surface, a first region of one conductivity type in said body and extending downwardly from said planar surface, said first region having an opening bounded by a predetermined number of sides through which a portion of said body projects so that said first region encircles said portion of said body, and a second region of the opposite conductivity type within said portion of said body and extending downwardly from said planar surface, said second region bounded by a predetermined number of sides and partialy overlapping said first region so that at least two rectifying junctions exist at the intersections of said first and second regions wherein each of said rectifying junctions has a finite area and is positioned with respect to said first and second regions so that the sum of said finite areas of said rectifying junctions is a constant value independent of the position of said second region with respect to said first region at said planar surface.

2. The device set forth in claim 1 wherein said diode is a zener diode and said rectifying junctions are zener breakdown junctions.

3. The device set forth in claim 2 wherein said predetermined number of sides bounding one of said opening of said first region and said second region is n sides where n is an even integer.

4. The device set forth in claim 3 wherein said predetermined number of sides bounding the other of said opening of said first region and said second region is m sides where m is an even integer.

5. The device set forth in claim 4 wherein each of said rectifying junctions is in one of said sides opposite another of said sides containing another of said rectifying junctions.

6. The device set forth in claim 5 wherein n is 4 and said sides are substantially straight.

7. The device set forth in claim 6 wherein m is 4 and said sides are substantially straight.

8. The device set forth in claim 7 wherein said first region is of N conductivity type material and is more highly doped adjacent said rectifying junctions than said second region.

9. The device set forth in claim 8 wherein said first region is more highly doped adjacent said rectifying junctions than said second region by a factor of about ten.

10. The device set forth in claim 9 including an overlap area in said first region adjacent said rectifying junction wherein said overlap area is more highly doped than said second region adjacent said rectifying junctions by a factor of about nine.

11. The device set forth in claim 7 wherein said second region is of N conductivity type material and is more highly doped adjacent said rectifying junctions than said first region.

12. The device set forth in claim 11 wherein said second region is more highly doped adjacent said rectifying junctions than said first region by a factor of about ten.

13. The device set forth in claim 12 including an overlap area in said first region adjacent said rectifying junction wherein said overlap area is more highly doped than said first region adjacent said rectifying junctions by a factor of about nine.

* * * * *